United States Patent
Vassiliev

Patent Number: 5,876,798
Date of Patent: Mar. 2, 1999

[54] METHOD OF FLUORINATED SILICON OXIDE FILM DEPOSITION

[75] Inventor: Vladislav Y. Vassiliev, Singapore, Singapore

[73] Assignee: Chartered Semiconductor Manufacturing, Ltd., Singapore, Singapore

[21] Appl. No.: 998,634

[22] Filed: Dec. 29, 1997

[51] Int. Cl.$^6$ .................................................. C23C 16/40
[52] U.S. Cl. .................................. 427/255.3; 427/255.7; 438/624; 438/763
[58] Field of Search ........................... 427/255.3, 255.7; 438/624, 763; 148/DIG. 43

[56] References Cited

U.S. PATENT DOCUMENTS

| | | | |
|---|---|---|---|
| 5,279,865 | 1/1994 | Chebi et al. | 427/574 |
| 5,288,518 | 2/1994 | Homma | 427/255 |
| 5,536,681 | 7/1996 | Jang et al. | 437/195 |
| 5,563,105 | 10/1996 | Dobuzinsky et al. | 437/240 |
| 5,571,576 | 11/1996 | Qian et al. | 427/574 |

OTHER PUBLICATIONS

Fukuda et al, "Highly reliable SiOF Film Formation using high Density Plasma Containing Hydrogen" Proceedings of the 1997 DUMIC Conf. Feb. 10–11, pp. 41–48.

Laxman et al, "Remote Microwave Plasma Enhanced CVD of fluorine doped silicon dioxide from FASI–4 and FTES", Proceedings of the 1997 DUMIC Conference Feb. 10–11 pp. 57–63.

Homma, "Characteristics of SiOF films formed using TEOS and FTES at room temp by CVD" in J. Electrochem. Soc. vol. 143, pp. 707–711 (Feb. 1996).

Kubo et al, "An $SiO_2$ film Depositon technology using tetraethylorthosilicate and ozone for interlayer metal dielectrics" J. Electrochem Soc. vol. 143, pp. 1769–1773 May, 1996.

Fujino et al, "Silicon Dioxide Deposition by Atmospheric Pressure and Low temperature CVD using TEOS and ozone" J. Electrochem Soc. vol. 137 pp. 2883–2887 Sep., 1990.

Primary Examiner—Shrive Beck
Assistant Examiner—Timothy Meeks
Attorney, Agent, or Firm—George O. Saile; Stephen B. Ackerman

[57] ABSTRACT

Films of fluorinated silicon oxide, suitable for use as intermetal dielectrics, have been deposited by means of CVD at reduced pressure using fluorotriethoxysilane (FTES) and tetra-exthyloxysilane (TEOS) as the precursors, together with ozone (mixed with oxygen). If tight control over the deposition conditions is exercised, high quality films having no surface damage and good step coverage, with no trapped voids, can be obtained. In a second embodiment of the invention, the TEOS is omitted and only FTES is used. Among the most important deposition parameters we include temperature at 400–500° C., pressure at 200–260 torr, ozone concentration (in oxygen) 8–12%, and an ozone:precursor ratio of 3–10 to 1 weight percent. In a third embodiment, a stacked layer is formed, consisting of at least one fluorinated silicon oxide layer and one silicon dioxide layer, deposited within the same deposition process by changing the TEOS or the FTES flow.

15 Claims, 2 Drawing Sheets

METHOD OF FLUORINATED SILICON OXIDE FILM DEPOSITION

BACKGROUND OF THE INVENTION (1) Field of the Invention

The invention relates to the general field of chemical vapor deposition with particular reference to the deposition of fluorinated silicon oxide films.

(2) Description of the Prior Art

As dimensions in integrated circuits grow ever smaller and as circuit speeds grow faster, the demands made on the materials from which they are formed grow ever more stringent. An example of this is the inter-metal dielectric layer (IMD) that is used to separate different levels of inter-circuit wiring. To minimize the incidence of mutually induced signals between two such levels it is necessary to make the IMD as thick as possible and its dielectric constant as low as possible.

In practice, considerations such as planarity and via plug integrity limit the maximum IMD thickness so attempts have been made in recent years to find alternative dielectrics to silicon dioxide which, till now, has been the material of choice for IMDS. Since silicon dioxide already has a low dielectric constant (about 4), the choice of materials is very limited.

A promising candidate to replace silicon dioxide as an IMD has been fluorinated silicon glass, known as FSG or SiOF. FSG films are known to have a dielectric constant of 3.2–3.6, depending on the fluorine concentration. The problem addressed by the present invention is to determine the best conditions under which to form FSG films. While many different ways that differ in detail have been described, they all depend on precursor gases that decompose under the influence of heat into fluorine, silicon and oxygen. The oxygen component is usually made more reactive through ionization/dissociation in a high density plasma (HDP) and/or by the inclusion of ozone in the mix. Depending on the exact conditions used, films of varying quality will be obtained. One such variable is step coverage with or without trapped voids internal to the film. Some examples include:

a) Fukuda et al. in "Highly reliable SiOF film formation using high density plasma containing hydrogen" in Proceedings of the 1997 DUMIC Conference February 10–11 pp. 41–48 describe using inorganic sources such as silane and silicon tetrafluoride together with a plasma generator and hydrogen. They were able to achieve films having dielectric constants between 3.3 and 3.6.

b) Laxman and Hochberg in "Remote microwave plasma enhanced CVD of fluorine doped silicon dioxide from FASI-4 and FTES" in Proceedings of the 1997 DUMIC Conference February 10–11 pp. 57–63 used fluorotriethoxysilane (FTES) in combination with an organosilicon compound and plasma activated oxygen to form SiOF films with about 8 atomic % fluorine and having dielectric constants around 3.6.

c) Instead of an organo silicon compound, Laxman and Hochberg also used TEOS (tetra-exthyloxysilane) [Si$(OC_2H_5)_4$].

d) Homma in "Characteristics of SiOF films formed using TEOS and FTES at room temperature by CVD" in J. Electrochem. Soc. vol. 143 1996 pp. 707–711 describes a process for undoped silicon oxide deposition at temperatures as low as 25° C. and atmospheric pressure using a hydrolysis reaction of a TEOS-FTES mixture with water vapor. Polymer-like film structures were found due to silicon oligomer formation during the hydrolysis reaction.

e) Instead of room temperature polymerization of TEOS and FTES with water vapor, Homma, in his patent (U.S. Pat. No. 5,288,518 February 1994) describes a CVD method for forming fluorine containing silicon oxide films at temperatures as low as 200° C., using decomposition of alkoxysilane and fluoroalkoxysilane vapor in the presence of ozone, or under ultraviolet radiation, or in a gas plasma. The resulting films were found to have a composition of $SiO_{1.85}F_{0.15}$. Boron or phosphorus-doped films were supposedly also formed by introduction of boron or phosphorus precursors in the gas mixture.

Note that all low temperature (around 200° C. and below) deposition methods for silicon dioxide have at least two well known, but nevertheless serious, disadvantages which make them unusable in today's reality. The first problem is structural recombination of material on heating above the original temperature of formation, which is a typical treatment in the manufacture of real devices. It leads to undesirable phenomena such as substantial shrinkage and stress in films, fluorine outdiffusion (followed by changes in dielectric constant), etc. The second problem is the phenomenon of enhanced moisture absorbtion by low temperature deposited silicon dioxide films which causes problems of instability of film properties.

f) Dobuzinsky et al. present a method of forming a fluorosilicate glass by reacting an $O_2$/Si precursor gas, a $F_2$ precursor gas, and hydrogen. The aim is to avoid the incorporation of C or N in the film. F concentration is controlled through the hydrogen which reacts with, and thus removes from the reaction site, excess F.

g) Kubo et al. in "An $SiO_2$ film deposition technology using tetraethylorthosilicate and ozone for interlayer metal dielectrics" in J. Electrochem. Soc. vol. 143 1996 pp. 1769–1773, describe the deposition of $SiO_2$ films (no fluorine) that exhibit good void free step coverage. Fujino et al. in "Silicon dioxide deposition by atmospheric pressure and low temperature CVD using TEOS and ozone" in J. Electrochem. Soc. vol 137 1990 pp. 2883–2887 report on the characteristics of films deposited in this way. Again, no fluorine was involved.

h) Qian et al. (U.S. Pat. No. 5,571,576 November 1996) form SiOF films using plasma CVD and no ozone, while Jang et al. (U.S. Pat. No. 5,536,681 July 1996) shows a method of oxide formation wherein a plasma treatment is followed by ozone/TEOS deposition.

As pointed out above, there is a wide range of conditions under which fluorinated silicon oxide films may be deposited. It has, however, been found that in many cases the resulting films are not entirely satisfactory. In TABLE I below we summarise some of the pros and cons of some of these methods:

TABLE I

| Formation method | Advantages | Disadvantages |
|---|---|---|
| Inorganic sources Hi density plasma | Excellent coverage and gap-fill | Possibility of plasma damage problems |
| Microwave plasma | Reduced plasma damage due to remote plasma | Non-conformal step coverage and gap-fill Possible voids; low deposition rates |

TABLE I-continued

| Formation method | Advantages | Disadvantages |
|---|---|---|
| Room temperature hydrolysis of TEOS and FTES | No plasma damage problems | Poor oxide quality; Changes in film properties with heating; Enhanced moisture absorption phenomena; Poor step coverage and gap-fill for submicron devices Low deposition rate |
| Low temperature decomposition of aloxisilanes and fluoroalkoxysilanes in the presence of ozone, under ultraviolet radiation or gas plasma; Phosphorus/boron doping of oxide is also possible | No plasma damage problems (without plasma or ultra-violet radiation) | Poor oxide quality; Change of properties with film heating; Enhanced moisture absorption phenomena; Possibility of plasma damage problems with plasma or ultraviolet activation; Non-conformal step coverage and gap fill, possible voids in submicron devices under plasma or ultraviolet; Increase of dielectric constant with dopants |
| Ozone based SiO$_2$ CVD | Excellent step cover and gap-fill; No plasma damage prob. | Surface sensitivity of chemical reactions |

Thus, none of the existing methods for preparing SiOF films are totally satisfactory even though many experimenters have tried a wide range of deposition conditions. As we will describe below, excellent films can be obtained but only over a relatively narrow range of deposition conditions.

SUMMARY OF THE INVENTION

It has been an object of the present invention to provide a method for depositing a fluorinated silicon oxide film that is fully compatible with existing deposition methods, particularly Chemical Vapor Deposition.

A further object of the present invention has been that said film be free of voids and provide good step coverage.

Yet another object has been that the surface covered by said film be free of any damage resulting from exposure to a plasma.

These objects have been achieved by means of LPCVD using fluorotriethoxysilane (FTES) and TEOS as the precursors, together with ozone (mixed with oxygen) at relatively high temperatures which are closer to those of post deposition heat treatments, given to the silicon dioxide, than the temperatures reported in the prior art. If tight control over the deposition conditions is exercised, high quality films having no surface damage and good step coverage, with no trapped voids, can be obtained. In a second embodiment of the invention, the TEOS is omitted and only FTES is used. Among the most important deposition parameters we include temperature 400°–500° C., pressure 200–260 torr, ozone concentration (in oxygen) 8–12%, and ozone:precursor ratio 3–10 to 1 weight percent. Besides the deposition of single layers, stacked FSG-silicon oxide layers, with each layer independently controlled, can be obtained.

DESCRIPTION OF THE PREFERRED EMBODIMENTS

Figure 1:
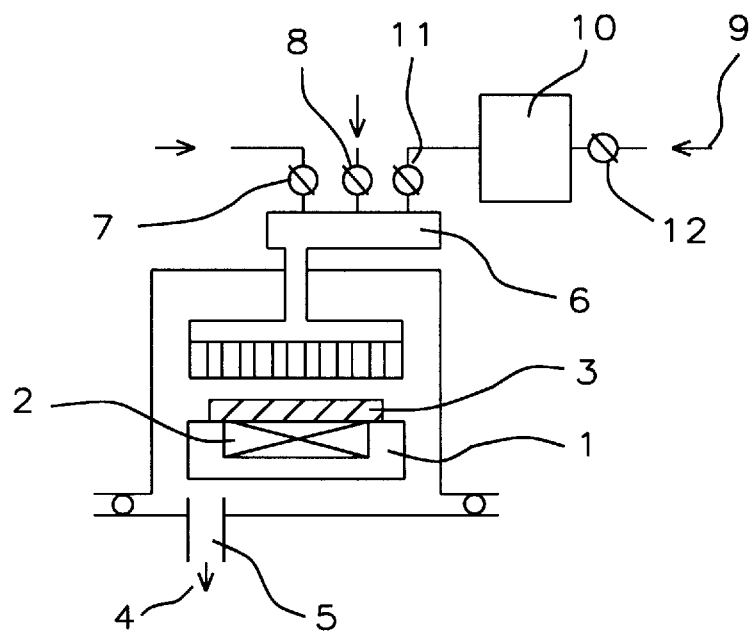
FIG. 1 shows a reaction chamber for CVD of the general type used for implementing the present invention.

In FIG. 1 we show a schematic view of a reaction chamber for CVD of the type used to implement the present invention. It consists of substrate holder 1 with heater 2 inside. Substrate 3, typically a silicon wafer, is placed on the holder which can be heated to a temperature of 500° C. or more with a precision of about 0.5°–1° C. Leaving the chamber is outlet 5 which is connected to pumping system 4 (not explicitly shown). The reaction chamber could also be positioned upside down from the position shown in FIG. 1.

Showerhead 6, which is placed in front of the substrate, has port 7 connected to a source of TEOS (not shown), port 8 connected to a source of FTES (not shown), and port 11 connected to ozone generator 10 and oxygen source 9. For each of these ports, located between the source and the manifold is a flow valve (collectively designated as 12). By controlling the setting for each flow valve individually as well as the pumping rate at 4, a mixture of TEOS, FTES, oxygen, and ozone, in any desired proportions, may be obtained inside the reaction chamber.

An ozone generator capable of producing ozone at a flow rate of up to 5,00 SCCM with a concentration level in oxygen of between about 0.5 and 14 weight % was used.

Since the vapor pressures of TEOS and FTES at room temperature are fairly low, it has been our practice to preheat our TEOS source to between about 20° and 60° C. and our FTES source to between about 20° and 60° C. prior to admitting them into the reaction chamber. The actual concentrations of the various components inside the reaction chamber depends on precursor/oxidant/inert gas ratios within the total gas flow as well as on total pressure in the chamber which was constantly momitored and controlled with a throttle valve. Holder temperature inside the reaction chamber was measured by thermocouple.

Since the method of the present invention includes both fluorinated and fluorine free silicon precursors, it allows to deposit a stacked dielectric by simply switching one of the precursors on or off during deposition time. These stack structures include at least one layer of silicon oxide and one layer of FSG. The structures provide improved deposition characteristics and improved film stability in particular cases.

As part of developing a first embodiment of the present invention, we have determined the best conditions for the deposition of SiOF films using the above setup to be as follows (all mixture concentrations given below are in volume % under normal conditions for TEOS, FTES, and oxygen and in weight % for ozone in oxygen):

concentration of TEOS in the mix to be between about 2 and 7%, although satisfactory films could still be obtained in the wider concentration range of from about 1 to 10%;

concentration of FTES in the mix to be between about 8 and 13%, although satisfactory films could still be obtained in the wider concentration range of from about 5 to 15%;

concentration of oxygen in the mix to be between about 50 and 70%, although satisfactory films could still be obtained in the wider concentration range of from about 40 to 80%;

percentage of ozone in the oxygen to be between about 8 and 12%, although satisfactory films could still be obtained in a wider concentration range of from about 0.5 to 15%;

total pressure between about 200–260 torr, although satisfactory films could still be obtained over a wider range of from about 10–760 torr;

temperature during film deposition between about 400°–500° C., although satisfactory films could still be obtained over a wider range of from about 250°–500° C.

In a second embodiment of the present invention it was determined that excellent films could be obtained if the TEOS was omitted entirely. For this embodiment, we have determined the best conditions for the deposition of SiOF films to be as follows:

concentration of FTES in the mix to be between about 5 and 12%, although satisfactory films could still be obtained in the wider concentration range of from about 2 to 15%;

concentration of oxygen in the mix to be between about 50 and 70%, although satisfactory films could still be obtained in the wider concentration range of from about 40 to 80%;

percentage of ozone in the oxygen to be between about 8 and 12%, although satisfactory films could still be obtained in a wider concentration range of from about 0.5 to 15%;

total pressure between about 200 and 260 torr, although satisfactory films could still be obtained over a wider range of from about 10 to 760 torr;

temperature during film deposition between about 400 and 500° C., although satisfactory films could still be obtained over a wider range of from about 250° to 500° C.

In a third embodiment of the invention the deposited film comprises a multi-layered stack. The best conditions for the deposition of the stack structure have been determined as follows:

a) for the silicon oxide layer concentration of TEOS in the mix to be between about 3 and 8 vol. % although satisfactory films could still be obtained in the wider concentration range of from about 1 to 15 vol. %.

concentration of oxygen in the mix to be between about 60 and 70 vol. % although satisfactory films could still be obtained in the wider concentration range of from about 40 to 70 vol. %.

percentage of ozone in oxygen to be between about 8 and 13 wt. % although satisfactory films could still be obtained in the wider concentration range of from about 0.5 to 15 vol. %.

total pressure between about 60 and 400 torr, although satisfactory films could still be obtained over a wider range of from about 10 to 760 torr;

temperature during film deposition between about 400° and 500° C., although satisfactory films could still be obtained over a wider range of from about 350° to 500° C.

thickness of a silicon oxide layer to be between about 500 and 1,000 Angstroms although thicknesses in the wider range between about 300 and 2,000 Angstroms were still satisfactory.

b) for the FSG layer deposition conditions were as previously described for the first and second embodiments.

It should be noted that it is essential that the relatively narrrow deposition conditions, as enumerated above for the two embodiments, be used if films of the highest quality are to be obtained. Similarly, methods such as plasma enhanced deposition must not be incorporated even though they may offer some short term advantages such as higher deposition rates. This can be seen by a consideration of FIGS. 2 and 3.

Figure 2:
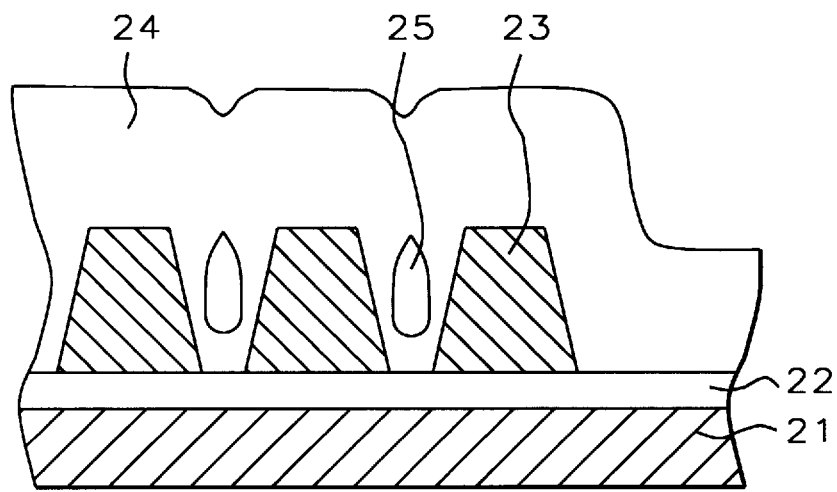
FIG. 2 is a cross-section of a metal layer covered by insulation deposited using PECVD, showing trapped voids.

FIG. 2 is a schematic cross-section, based on an actual micrograph, of semiconductor or metal layer 21, insulating layer 22, and lines 23 that has been covered by oxide layer 24, deposited using plasma enhanced CVD. As can be seen, although a considerable degree of planarization has been achieved, voids 25 have been incorporated inside 24 making it unreliable for future use.

Figure 3:
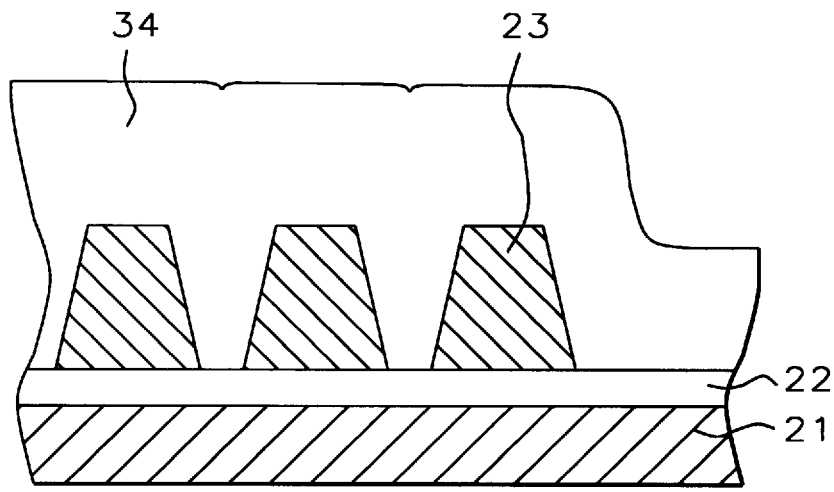
FIG. 3 is a cross-section of a metal layer covered by insulation deposited using TEOS/ozone, showing excellent planarization and no trapped voids.

FIG. 3 is a schematic cross-section, also based on an actual micrograph, of semiconductor or metal layer 21, insulating layer 22, and lines 23 that has been covered by oxide layer 34, deposited using ozone/TEOS based CVD. As can be seen, 34 has achieved an even higher degree of planarization, without the inclusion of any voids.

Figure 4:
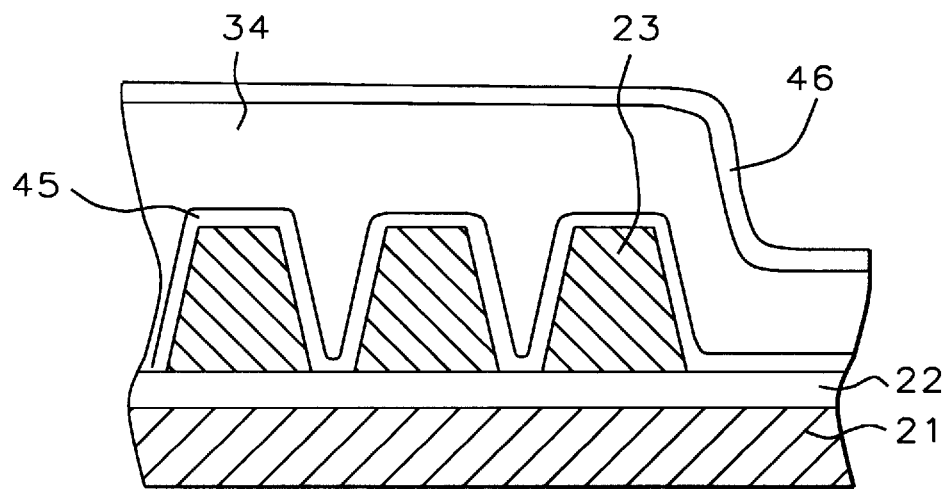
FIG. 4 is a cross-section of a metal layer covered by a stacked film.

FIG. 4 is a schematic cross-section showing semiconductor or metal layer 21, insulating layer 22, lines 23, fluorinated oxide film 34, lower silicon oxide layer 45 (for preventing fluorine interaction with the metal lines) and upper silicon dioxide layer 46 (for preventing moisture absortion and fluorine outdiffusion). All layers can be deposited within the same process by changing the flow rates of the TEOS and FTES.

While the invention has been particularly shown and described with reference to the preferred embodiments thereof, it will be understood by those skilled in the art that various changes in form and details may be made without departing from the spirit and scope of the invention.

What is claimed is:

1. A method for depositing a layer of fluorinated silicon dioxide, comprising:

providing a reaction chamber;

maintaining said chamber at a temperature between about 400° and 500° C. and at a pressure between about 200 and 260 torr;

admitting into the chamber a mixture of fluorotriethoxysilane, present in a first concentration, tetraexthyloxysilane, present in a second concentration, and oxygen, present in a third concentration and containing a percentage of ozone, whereby deposition of the layer begins; and when the layer has reached a thickness, terminating the deposition by reducing the temperature and evacuating the chamber.

2. The method of claim 1 wherein said first concentration is between about 5 and 15 volume % of the mixture.

3. The method of claim 1 wherein said second concentration is between about 1 and 10 volume % of the mixture.

4. The method of claim 1 wherein said third concentration is between about 40 and 80 volume % of the mixture.

5. The method of claim 1 wherein said percentage of ozone in the oxygen is between about 0.5 and 15 weight %.

6. The method of claim 1 wherein said thickness of the deposited layer is between about 1,000 and 20,000 Angstroms.

7. A method for depositing a stacked dielectric layer comprising:

depositing a layer of fluorinated silicon dioxide in accordance with the method of claim 1; and depositing on said layer of fluorinated silicon dioxide a layer of silicon oxide that is between about 300 and 2,000 Angstroms thick.

8. A method for depositing a stacked dielectric layer comprising:

depositing a layer of silicon oxide that is between about 300 and 2,000 Angstroms thick; and depositing on said layer of silicon oxide a layer of fluorinated silicon dioxide in accordance with the method of claim 1.

9. A method for depositing a layer of fluorinated silicon dioxide, comprising:

providing a reaction chamber;

maintaining said chamber at a temperature between about 400° and 500° C. and at a pressure between about 200 and 260 torr;

admitting into the chamber a mixture of fluorotriethoxysilane, present in a first concentration, and oxygen, present in a second concentration and containing a percentage of ozone, whereby deposition of the layer begins; and when the layer has reached a thickness, terminating said deposition by reducing the temperature and evacuating the chamber.

10. The method of claim 9 wherein said first concentration is between about 2 and 15 volume % of the mixture.

11. The method of claim 9 wherein said second concentration is between about 40 and 80 volume % of the mixture.

12. The method of claim 9 wherein said percentage of ozone in the oxygen is between about 0.5 and 15 weight %.

13. The method of claim 9 wherein said thickness of the deposited layer is between about 1,000 and 20,000 Angstroms.

14. A method for depositing a stacked dielectric layer comprising:

depositing a layer of fluorinated silicon dioxide in accordance with the method of claim 9; and depositing on said layer of fluorinated silicon dioxide a layer of silicon oxide that is between about 300 and 2,000 Angstroms thick.

15. A method for depositing a stacked dielectric layer comprising:

depositing a layer of silicon oxide that is between about 300 and 2,000 Angstroms thick; and depositing on said layer of silicon oxide a layer of fluorinated silicon dioxide in accordance with the method of claim 9.

* * * * *